(12) United States Patent
Tauchi et al.

(10) Patent No.: US 7,476,431 B2
(45) Date of Patent: Jan. 13, 2009

(54) SILVER ALLOY REFLECTIVE FILMS FOR OPTICAL INFORMATION RECORDING MEDIA, SILVER ALLOY SPUTTERING TARGETS THEREFOR, AND OPTICAL INFORMATION RECORDING MEDIA

(75) Inventors: Yuki Tauchi, Kobe (JP); Junichi Nakai, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 61 days.

(21) Appl. No.: 11/375,036

(22) Filed: Mar. 15, 2006

(65) Prior Publication Data

US 2006/0234001 A1 Oct. 19, 2006

(30) Foreign Application Priority Data

Apr. 14, 2005 (JP) ............................. 2005-117313

(51) Int. Cl.
*B32B 3/02* (2006.01)

(52) U.S. Cl. ................. 428/64.1; 428/64.4; 430/270.11

(58) Field of Classification Search ................ 428/64.1, 428/64.4; 430/270.12
See application file for complete search history.

(56) References Cited

U.S. PATENT DOCUMENTS

| | | | |
|---|---|---|---|
| 4,743,526 A | | 5/1988 | Ando et al. |
| 4,998,239 A | * | 3/1991 | Strandjord et al. ....... 369/275.1 |
| 5,948,497 A | | 9/1999 | Hatwar et al. |
| 5,989,669 A | * | 11/1999 | Usami ....................... 428/64.1 |
| 6,007,889 A | | 12/1999 | Nee |
| 6,229,785 B1 | | 5/2001 | Kitaura et al. |
| 6,280,811 B1 | | 8/2001 | Nee |
| 6,544,616 B2 | | 4/2003 | Nee |
| 6,689,444 B2 | * | 2/2004 | Nakai et al. ................ 428/64.1 |
| 7,203,003 B2 | | 4/2007 | Nakai et al. |
| 2002/0034603 A1 | | 3/2002 | Nee |

(Continued)

FOREIGN PATENT DOCUMENTS

CN 1483852 A 3/2004

(Continued)

OTHER PUBLICATIONS

U.S. Appl. No. 11/313,815, filed Dec. 22, 2005, Yuuki Tauchi, et al.

(Continued)

*Primary Examiner*—Elizabeth Mulvaney
(74) *Attorney, Agent, or Firm*—Oblon, Spivak, McClelland, Maier & Neustadt, P.C.

(57) ABSTRACT

A silver alloy reflective film is used in an optical information recording medium and contains silver as a main component, a total of 0.01 to 3 atomic percent of at least one of Bi and Sb, and a total of 3 to 42 atomic percent of at least one of Cu, Ge, Mg, and Zn. The silver alloy reflective film preferably further contains 0.1 to 3 atomic percent of yttrium. An optical information recording medium includes the silver alloy reflective film. A sputtering target for depositing the silver alloy reflective film contains silver as a main component, 0.01 to 3 atomic percent of Sb (or 0.03 to 10 atomic percent of Bi), and a total of 3 to 42 atomic percent of at least one of Cu, Ge, Mg, and Zn.

21 Claims, 1 Drawing Sheet

U.S. PATENT DOCUMENTS

| | | |
|---|---|---|
| 2003/0143342 A1 | 7/2003 | Fujii et al. |
| 2004/0028912 A1 | 2/2004 | Tauchi et al. |
| 2004/0226818 A1 | 11/2004 | Takagi et al. |
| 2004/0238356 A1 | 12/2004 | Matsuzaki et al. |
| 2004/0253137 A1 | 12/2004 | Gehlert et al. |
| 2004/0258872 A1 | 12/2004 | Nee |
| 2004/0263984 A1 | 12/2004 | Nakai et al. |
| 2005/0008883 A1 | 1/2005 | Takagi et al. |
| 2005/0112019 A1 | 5/2005 | Nakai et al. |
| 2005/0153162 A1 | 7/2005 | Takagi et al. |
| 2005/0238839 A1 | 10/2005 | Takagi et al. |
| 2005/0287333 A1 | 12/2005 | Takagi et al. |
| 2006/0013988 A1 | 1/2006 | Tauchi et al. |
| 2006/0234001 A1 | 10/2006 | Tauchi et al. |

FOREIGN PATENT DOCUMENTS

| | | |
|---|---|---|
| CN | 1577550 A | 2/2005 |
| DE | 103 36 228 A1 | 4/2004 |
| EP | 1 589 531 A2 | 10/2005 |
| JP | 62-227050 | 10/1987 |
| JP | 4-28032 | 1/1992 |
| JP | 4-252440 | 9/1992 |
| JP | 5-258363 | 10/1993 |
| JP | 6-208732 | 7/1994 |
| JP | 2000-57627 | 2/2000 |
| JP | 2001-184725 | 7/2001 |
| JP | 2002-15464 | 1/2002 |
| JP | 2004-158145 | 6/2004 |
| JP | 2005-15893 | 1/2005 |
| JP | 2005-48231 | 2/2005 |
| WO | WO 98/09823 | 3/1998 |
| WO | WO 2004/094135 A1 | 11/2004 |

OTHER PUBLICATIONS

U.S. Appl. No. 11/353,168, filed Feb. 14, 2006, Yuuki Tauchi, et al.
U.S. Appl. No. 11/333,492, filed Jan. 18, 2006, Yuki Tauchi, et al.
U.S. Appl. No. 11/428,045, filed Jun. 30, 2006, Fujii, et al.
U.S. Appl. No. 11/425,062, filed Jun. 19, 2006, Tauchi, et al.
U.S. Appl. No. 11/425,068, filed Jun. 19, 2006, Nakai, et al.
U.S. Appl. No. 11/375,036, filed Mar. 15, 2006, Tauchi, et al.
U.S. Appl. No. 11/612,791, filed Dec. 19, 2006, Nakano, et al.
U.S. Appl. No. 12/100,823, filed Apr. 10, 2008, Tauchi, et al.

* cited by examiner

SILVER ALLOY REFLECTIVE FILMS FOR OPTICAL INFORMATION RECORDING MEDIA, SILVER ALLOY SPUTTERING TARGETS THEREFOR, AND OPTICAL INFORMATION RECORDING MEDIA

BACKGROUND OF THE INVENTION

1. Field of the Invention

The present invention relates to silver (Ag) alloy reflective films for optical information recording media, Ag alloy sputtering targets for the deposition thereof, and optical information recording media. More specifically, it relates to reflective films which have low thermal conductivities, low melting temperatures, high reflectivities, and high corrosion resistance and therefore enable marking of optical information recording media such as CDs, DVDs, Blu-ray Discs, and HD-DVDs typically using laser after the preparation of the media. The present invention-also relates to sputtering targets for the deposition of the reflective films, and optical information recording media having the reflective films.

2. Description of the Related Art

Optical information recording media (optical discs) include various types, and the three main types categorized by the writing/reading system are read-only, write-once, and rewritable optical discs.

Of these optical discs, read-only discs have recorded data formed by concave and convex pits on a transparent plastic substrate upon the manufacture of the discs, and a reflective film layer mainly containing, for example, Al, Ag, or Au is arranged on the recorded data. The data are read out (reproduced) by detecting phase difference or reflection difference of laser beam applied to the discs. Certain optical discs include a substrate containing recording pits and a reflective film layer arranged on the recording pits, and another substrate bearing recording pits and a semi-reflective layer arranged on the recording pits. The two substrates are laminated, and the data recorded on the two layers are read out. Data recorded on one side according to this recording/reproducing system are read-only data that cannot be additionally wrote and altered, and optical discs using this system include CD-ROMs and DVD-ROMs. FIG. 1 is a schematic view of a sectional structure of a read-only optical disc. The optical disc in FIG. 1 includes a polycarbonate substrate 1, a semi-reflective layer (Au, Ag, and Si) 2, an adhesive layer 3, a total-reflective film layer (Ag alloy) 4, and an ultraviolet-curable resin protective layer 5.

These read-only optical discs are produced in quantities, and information is recorded upon production of the discs by pressing with stampers having patterns of the information. Thus, IDs cannot be significantly given to individual discs. However, read-only optical discs individually having IDs formed using a dedicated system such as a label gate system or a burst cutting area (BCA) system after the preparation of the discs are being standardized typically for preventing unauthorized copying, improving traceability in distribution of products, and increasing added values of products. The ID marking (recording) is mainly carried out by a method of applying laser beam to discs after production to melt an Al alloy in the reflective film and to form holes therein.

Aluminum alloys, such as Al—Mg alloys according to Japanese Industrial Standards (JIS) 6061, are distributed in quantities as general construction materials, are inexpensive and are thereby widely used as reflective films of read-only optical discs.

The JIS 6061 Al alloys, however, are not intended to undergo laser marking and thereby have following problems. Specifically, the Al alloys have high thermal conductivities and require high laser power for marking, which results in damages on base materials including polycarbonate substrates and adhesive layers. Additionally, voids formed as a result of laser marking invite corrosion of the reflective film in constant temperature and constant humidity tests conducted after laser marking, because the Al alloys have low corrosion resistance.

Recordable optical discs often use Ag alloys having higher reflectivities as reflective films. The resulting reflective films containing Ag alloys, however, show decreased reflectivities at high temperatures due to cohesion of Ag reflective films caused by the low thermostability of Ag. Various proposals have been made to solve this problem and to improve the durability. For example, Japanese Laid-open (Unexamined) Patent Application Publication (JP-A) No. 2002-15464 discloses a technique of inhibiting the grain growth (cohesion) of Ag by incorporating 0.1 to 3 atomic percent of a rare-earth element into Ag. JP-A No. 2004-139712 discloses a technique of further improving reflectivity and durability while ensuring high thermal conductivity by incorporating Bi or Sb into Ag.

JP-A No. 04-252440 discloses a method for reducing the thermal conductivity of an Ag alloy by incorporating Ge, Si, Sn, Pb, Ga, In, Tl, Sb, or Bi into Ag. JP-A No. 04-28032 discloses a method for reducing the thermal conductivity of an Ag alloy by incorporating Cr, Ti, Si, Ta, Nb, Pt, Ir, Fe, Re, Sb, Zr, Sn, or Ni into Ag. The resulting reflective films obtained according to these techniques, however, are not intended to be melted and removed by laser irradiation, and some of them show increasing melting temperatures with decreasing thermal conductivities thereof. Silver alloys (Ag alloys) satisfying requirements as Ag alloys for laser marking have not yet been provided.

As is described above, Ag alloys provided for laser marking must have low thermal conductivities, low melting temperatures, high corrosion resistance, and high thermostability.

Current reflective films for read-only optical discs use JIS 6061 series Ag alloys, but these Ag alloys do not satisfy the requirements for laser marking in thermal conductivity and corrosion resistance.

SUMMARY OF THE INVENTION

Under these circumstances, an object of the present invention is to provide an Ag alloy reflective film for optical information recording media which can be easily marked by laser when used in read-only optical discs. Another object of the present invention is to provide an optical information recording medium including the reflective film, and a sputtering target for the deposition of the reflective film.

After intensive investigations to achieve the above objects, the present inventors have found that an Ag alloy thin film containing Ag and a specific content of a specific alloying element has a low thermal conductivity, low melting temperature, and high corrosion resistance and serves as a reflective thin layer (thin metal layer) suitable as a reflective film for optical information recording that can be provided for laser marking. The present invention has been accomplished based on these findings and can achieve the above objects.

Specifically, the present invention relates to Ag alloy reflective films for optical information recording media, optical information recording media, and Ag alloy sputtering targets for the deposition of the Ag alloy reflective films and provides Ag alloy reflective films for optical information recording media in a first aspect, optical information recording media in a second aspect, and Ag alloy sputtering targets for the deposition of the Ag alloy reflective films in third and fourth aspects.

Specifically, the present invention provides, in the first aspect, an Ag alloy reflective film for optical information recording media, containing Ag as a main component, a total of 0.01 to 3 atomic percent of at least one of Bi and Sb, and a total of 3 to 42 atomic percent of at least one selected from the group consisting of Cu, Ge, Mg, and Zn.

The Ag alloy reflective film for optical information recording media can further contain 0.1 to 3 atomic percent of Y.

The present invention also provides, in the second embodiment, an optical information recording medium containing the Ag alloy reflective film according to the first aspect.

The optical information recording medium can be used for laser marking.

In addition, the present invention provides, in the third aspect, an Ag alloy sputtering target for the deposition of Ag alloy reflective films for optical information recording media, containing Ag as a main component, 0.01 to 3 atomic percent of Sb, and a total of 3 to 42 atomic percent of at least one selected from the group consisting of Cu, Ge, Mg, and Zn.

In the fourth aspect, the present invention provides an Ag alloy sputtering target for the deposition of Ag alloy reflective films for optical information recording, containing Ag as a main component, 0.03 to 10 atomic percent of Bi, and a total of 3 to 42 atomic percent of at least one selected from the group consisting of Cu, Ge, Mg, and Zn.

The Ag alloy sputtering targets according to the third and fourth aspects can further contain 0.1 to 3 atomic percent of Y.

The Ag alloy reflective films for optical information recording media according to the present invention can be easily marked by laser when used in read-only optical discs. The optical information recording media according to the present invention include the Ag alloy reflective films and can be suitably marked by laser when used as read-only optical discs. By using the Ag alloy sputtering targets according to the present invention, the Ag alloy reflective films can be deposited.

Further objects, features and advantages of the present invention will become apparent from the following description of the preferred embodiments with reference to the attached drawing.

DESCRIPTION OF THE PREFERRED EMBODIMENTS

Figure 1:
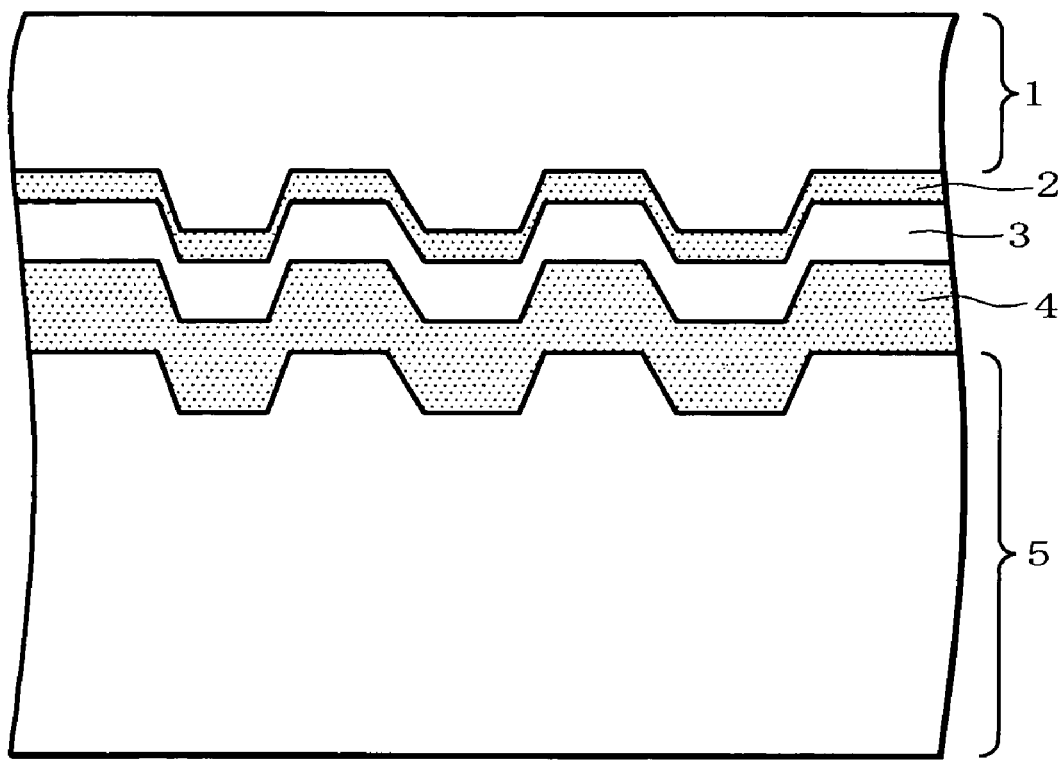
FIG. 1 is a schematic view of a sectional structure of a read-only optical disc.

As is described above, Ag alloy thin films provided for laser marking must have low thermal conductivities, low melting temperatures, and high corrosion resistance.

The present inventors made Ag alloy sputtering targets containing Ag and a variety of elements, produced Ag alloy thin films having various compositions by sputtering using these targets, determined the compositions and properties of the thin films as reflective thin layers, and found the following (1) and (2).

(1) By incorporating into Ag, a total of 3 to 42 atomic percent of at least one selected from the group consisting of Cu, Ge, Mg, and Zn, namely, one or more of Cu, Ge, Mg, and Zn, the resulting Ag alloy thin film can have an increased absorptivity of laser beam for use in marking, a reduced thermal conductivity, and a reduced melting temperature (liquidus temperature). This thin film can be marked by laser at a lower laser power and therefore can be easily marked by laser. If the total content of these elements is less than 3 atomic percent, these effects are not sufficiently exhibited. If it exceeds 42 atomic percent, the resulting thin film has an increased melting temperature and a significantly reduced initial reflectivity and is not suitably used as a reflective film that can be suitably marked by laser.

(2) By further incorporating a total of 0.01 to 3 atomic percent of at least one of Bi and Sb, the corrosion resistance can be improved to significantly inhibit the reduction of reflectivity under conditions of high temperatures and high humidity. The resulting reflective film has improved durability. If the total content of these elements is less than 0.01 atomic percent, these effects are not sufficiently exhibited. The total content exceeding 3 atomic percent invites a reduced reflectivity and coloring of the reflective film.

The present invention has been achieved based on these findings and provides Ag alloy reflective films for optical information recording media, optical information recording media, and sputtering targets for the deposition of the Ag alloy reflective films which have the above configurations.

The Ag alloy reflective films for optical information recording media according to the first aspect of the present invention thus achieved are Ag alloy reflective films each comprising Ag as a main component, a total of 0.01 to 3 atomic percent of at least one of Bi and Sb, and a total of 3 to 42 atomic percent of at least one selected from the group consisting of Cu, Ge, Mg, and Zn.

As is obvious from the above findings (1) and (2), the Ag alloy reflective films for optical information recording media have low thermal conductivities and low melting temperatures (liquidus temperatures) and can be easily marked by laser at a lower laser power. They are excellent in corrosion resistance, are prevented from decreased reflectivity under conditions of high temperatures and high humidity, and have excellent durability.

Accordingly, the Ag alloy reflective films according to the present invention have low thermal conductivities, low melting temperatures, excellent corrosion resistance, can be satisfactorily marked by laser, and are advantageously used as reflective films for optical information recording media. Specifically, they can be easily marked by laser at a lower laser power, and the reduction of reflectivity thereof under conditions of high temperatures and high humidity can be significantly inhibited.

When the Ag alloy reflective films for optical information recording media according to the present invention further comprise 0.1 to 3 atomic percent of Y (the second embodiment), they have further lower thermal conductivities and can be more easily marked by laser. If the content of Y is less than 0.1 atomic percent, this effect may not be sufficiently exhibited. If it exceeds 3 atomic percent, the reduction of reflectivity may increase under conditions of high temperatures and high humidity.

The thickness of the Ag alloy reflective films for optical information recording media is preferably 10 nm to 200 nm and more preferably 20 nm to 100 nm. The reasons for specifying the range will be described below. Laser marking can be carried out more easily with a decreasing thickness of the reflective film. However, if the thickness is as small as less than 10 nm, the reflective film may transmit the laser beam and thereby have a reduced reflectivity. Thus, the thickness is preferably 10 nm or more, and more preferably 20 nm or more. In contrast, if the Ag alloy reflective film has an excessively large thickness as large as exceeding 200 nm, the laser energy to melt the reflective film must be increased, and marks become difficult to form. Thus, the thickness is preferably 200 nm or less, and more preferably 100 nm or less. Additionally, the surface smoothness of the film decreases and the laser beam may become susceptible to scattering with an increasing thickness, to fail to yield high signal output. Thus, the thickness is preferably 20 nm or less and more preferably 100 nm or less.

The optical information recording media according to the present invention comprise any of the Ag alloy reflective films for optical information recording media according to the present invention (second aspect). They are excellent in following properties. Specifically, they can be satisfactorily marked by laser and avoid thermal damages of constitutional components of discs, such as polycarbonate substrate and adhesive layer. They also have excellent corrosion resistance and are free from reduction of reflectivity under conditions of high temperatures and high humidity.

The optical information recording media according to the present invention have the above-mentioned excellent properties and can be advantageously marked by laser.

The Ag alloy sputtering targets according to the present invention include a sputtering target for the deposition of Ag alloy reflective films for optical information recording media, comprising Ag as a main component, 0.01 to 3 atomic percent of Sb, and a total of 3 to 42 atomic percent of at least one selected from the group consisting of Cu, Ge, Mg, and Zn (third aspect) They also include an Ag alloy sputtering target for the deposition of Ag alloy reflective films for an optical information recording medium, comprising Ag as a main component, 0.03 to 10 atomic percent of Bi, and a total of 3 to 42 atomic percent of at least one selected from the group consisting of Cu, Ge, Mg, and Zn (fourth aspect).

By using these Ag alloy sputtering targets, the Ag alloy reflective films for optical information recording media according to the first aspect of the present invention can be deposited. Specifically, the former Ag alloy sputtering target according to the third aspect can yield, of the Ag alloy reflective films for optical information recording media according to the first aspect, an Ag alloy reflective film comprising 0.01 to 3 atomic percent of Sb and a total of 3 to 42 atomic percent of at least one selected from the group consisting of Cu, Ge, Mg, and Zn (hereinafter also referred to as Ag alloy reflective film (A)). The latter Ag alloy sputtering target according to the fourth aspect can yield, of the Ag alloy reflective films for optical information recording media according to the first aspect, an Ag alloy reflective film comprising 0.01 to 3 atomic percent of Bi and a total of 3 to 42 atomic percent of at least one selected from the group consisting of Cu, Ge, Mg, and Zn (hereinafter also referred to as Ag alloy reflective film (B)). The Ag alloy sputtering target according to the third aspect and the Ag alloy reflective film (A) deposited using the same are the same as each other in Sb content and total content of the at least one of Cu, Ge, Mg, and Zn. In contrast, the Ag alloy sputtering target according to the fourth aspect and the Ag alloy reflective film (B) deposited by using the same are the same as each other in total content of the at least one of Cu, Ge, Mg, and Zn but are different in Bi content. Specifically, the sputtering target has a larger Bi content than that of the reflective film. This is because the contents of Cu, Ge, Mg, Zn and Sb of the sputtering target are reflected to the contents of the elements in the resulting reflective film, but the Bi content of the reflective film decreases to several ten percent of the Bi content of the sputtering target. Therefore, the Ag alloy sputtering target according to the fourth aspect has the above-specified composition (contents).

When the Ag alloy sputtering targets according to the present invention further comprise 0.1 to 3 atomic percent of Y, they can yield the Ag alloy reflective film for optical information recording media according to the second embodiment. In the case of Y, the Y content of the sputtering target is reflected to the Y content of the resulting reflective film without reduction.

EXAMPLES

The present invention will be illustrated in further detail with reference to several Examples and Comparative Examples below. It is to be noted that the followings are only examples which by no means limit the scope of the present invention, and various changes and modifications are possible therein without departing from the teaching and scope of the present invention.

Hereinafter an Ag alloy comprising $M_1$ and $M_2$ is indicated as Ag-$M_1$-$M_2$ alloy, and an Ag alloy comprising $M_1$, $M_2$ and $M_3$ is indicated as Ag-$M_1$-$M_2$-$M_3$ alloy. An Ag alloy comprising x atomic percent of $M_1$ and y atomic percent of $M_2$ is indicated as Ag-x$M_1$-y$M_2$ alloy, and an Ag alloy comprising x atomic percent of $M_1$, y atomic percent of $M_2$, and z atomic percent of $M_3$ is indicated as Ag-x$M_1$-y$M_2$-z$M_3$ alloy. Specifically, "Ag-$M_1$-$M_2$ alloy" means an Ag alloy comprising $M_1$ and $M_2$, and "Ag-$M_1$-$M_2$-$M_3$ alloy" means an Ag alloy comprising $M_1$, $M_2$ and $M_3$. Likewise, "Ag-x$M_1$-y$M_2$ alloy" means an Ag alloy comprising x atomic percent of $M_1$ and y atomic percent of $M_2$, and "Ag-x$M_1$-y$M_2$-z$M_3$ alloy" means an Ag alloy comprising x atomic percent of $M_1$, y atomic percent of $M_2$, and z atomic percent of $M_3$.

Experimental Example 1

On a polycarbonate substrate having a thickness of 0.6 mm and a diameter of 120 mm were deposited Ag—Bi—Cu alloy (Ag alloy comprising Bi and Cu) thin films, Ag—Bi—Ge alloy thin films, Ag—Bi—Mg alloy thin films, and Ag—Bi—Zn alloy thin films respectively by DC magnetron sputtering.

The thus-deposited Ag alloy thin films were subjected to determination of the melting temperature, thermal conductivity and reflectivity and to laser marking.

The melting temperatures of the Ag alloy thin films were measured in the following manner. A sample Ag alloy thin film having a thickness of 1 μm was peeled off from the substrate, and about 5 mg of the peeled film was collected and analyzed using a differential thermal analyzer (DTA). In this procedure, the average of the temperature at which the film starts to melt and the temperature at which the film melting is terminated was defined as the melting temperature. The thermal conductivity was converted from the electrical resistance of a sample Ag alloy thin film deposited to a thickness of 100 nm.

The reflectivity of a sample Ag alloy thin film deposited to a thickness of 100 nm was measured at a wavelength of 405 nm using the V-570 Ultraviolet and Visible Ray Spectrometer (JASCO Corporation) and this was defined as the reflectivity. The reflectivities were measured on Ag alloy thin films after deposition and Ag alloy thin films after tests under conditions of high temperatures and high humidity (environmental tests). The environmental tests were conducted at a temperature of 80° C and humidity of 90% relative humidity (RH) for a holding time of 100 hours.

The laser marking was carried out using the POP-120-8R (Hitachi Computer Peripherals Co., Ltd.) at a laser power of 1.5 W, a laser spot size of 30 μm×1 μm, and a beam speed of 5 m per second using a sample Ag alloy thin film having a thickness of 50 nm. For evaluating the laser marking ability, the ratio of a melted portion to the area of laser irradiation was determined, and thin films having the ratio of 80% or more are evaluated as "Good" in laser marking ability.

The results are shown in Table 1. Table 1 shows that, of the Ag—Bi—Cu alloy thin films (Nos. 2 to 10), those having a Cu content of 3 atomic percent or more (No. 3 to 10), the Ag—Bi—Ge alloy thin film (No. 11), the Ag—Bi—Mg alloy thin film (No. 12), and the Ag—Bi—Zn alloy thin film (No. 13) have lower thermal conductivities and lower melting temperatures than the pure Ag thin film (No. 1). This is because of the addition of Cu, Ge, Mg, and/or Zn. Specifically, by incorporating Cu, Ge, Mg, and/or Zn, the thermal conductivities and melting temperatures of thin films can be reduced.

Of the Ag—Bi—Cu alloy thin films (No. 2 to 10), one having a Cu content of less than 3 atomic percent (No. 2) shows less reduction of thermal conductivity to have a relatively high thermal conductivity and shows substantially no reduction of melting temperature to have a high melting temperature. Thus, this thin film was assessed as "Failure" in laser marking ability. The Ag—Bi—Cu alloy thin film having a Cu content exceeding 42 atomic percent (No. 6) has a significantly reduced initial reflectivity and is insufficient as a reflective film. The Ag—Bi—Cu alloy thin film having a Bi content of less than 0.01 atomic percent (No. 7) shows a significantly reduced reflectivity in the environmental test. One having a Bi content exceeding 3 atomic percent (No. 10) shows a significantly reduced initial reflectivity, is therefore insufficient as a reflective film and shows a significantly reduced reflectivity in the environmental test. Accordingly, these thin films are generally evaluated as "Failure".

In contrast, the Ag—Bi—Cu alloy thin films having a Cu content of 3 to 42 atomic percent and a Bi content of 0.01 to 3 atomic percent (Nos. 3 to 5, and Nos. 8 and 9) show significant reduction of thermal conductivity to have relatively low thermal conductivities, show significant reduction of melting temperature to have low melting temperatures and therefore have "Good" laser marking ability. They also have sufficiently high initial reflectivities, show less reduction of reflectivity in the environmental tests and thereby have sufficiently high reflectivities even after the environmental tests. These thin films are therefore generally evaluated as "Good".

The Ag—Bi—Ge alloy thin film (No. 11), Ag—Bi—Mg alloy thin film (No. 12), and Ag—Bi—Zn alloy thin film (No. 13) satisfy the requirements in contents and have total contents of at least one of Ge, Mg, and Zn within the range of 3 to 42 atomic percent and Bi content within the range of 0.01 to 3 atomic percent. They therefore show significant reduction of thermal conductivity to have relatively low thermal conductivities, show significant reduction of melting temperature to have low melting temperatures, and have "Good" laser marking abilities. They also have sufficiently high initial reflectivities, show less reduction of reflectivity in the environmental tests, and thereby have sufficiently high reflectivities even after the environmental tests. These thin films are therefore generally evaluated as "Good".

Experimental Example 2

Ag—Bi—Cu—Y alloy thin films were deposited on the same substrate as in Experimental Example 1, subjected to determination of the thermal conductivity and reflectivity, subjected to laser marking, and evaluated by the procedures of Experimental Example 1.

The results are shown in Table 2. Table 2 indicates that, by adding Y, the thin films can have further reduced thermal conductivities and can be further easily marked by laser. This effect is insufficient in the thin film having a Y content less than 0.1 atomic percent (No. 2A). The thin film having a Y content exceeding 3 atomic percent (No. 6A) has a low initial reflectivity and shows significant reduction of reflectivity in the environmental test.

Specifically, the thin films of Nos. 2A to 6A in Table 2 correspond to the Ag—0.1% Bi—15% Cu alloy thin film (No. 4) in Table 1, except for further comprising Y. Accordingly, they can be compared with the Ag—0.1% Bi—15% Cu alloy thin film (No. 4) in Table 1. The thin film of No. 2A having a Y content of 0.05 atomic percent has a thermal conductivity and ability (easiness) in laser marking equivalent to those of the Ag—0.1% Bi—15% Cu alloy thin film (No. 4). The thin films of Nos. 3A to 6A having Y contents of 0.1 to 5.0 atomic percent have lower thermal conductivities than the Ag—0.1% Bi—15% Cu alloy thin film (No. 4). This indicates that the thermal conductivity decreases and the laser marking can be conducted more easily with an increasing Y content. Of these thin films, however, the thin film of No. 6A having a Y content of 5.0 atomic percent has a low initial reflectivity and shows significant reduction of reflectivity in the environmental test. In contrast, the thin films of Nos. 3A to 5A having Y contents of 0.1 to 3.0 atomic percent do not invite such significant reduction of reflectivity and are thereby excellent.

TABLE 1

| No. | Composition | Melting temperature (°C.) | Thermal conductivity (W/Kcm) | Reflectivity ($\lambda$ = 405 nm) | Absorptivity (%) ($\lambda$ = 405 nm) | Change in reflectivity after environmental test (%) | Laser marking ability | Evaluation |
| --- | --- | --- | --- | --- | --- | --- | --- | --- |
| 1 | pure Ag | 960 | 3.14 | 93.7 | 6.3 | −45.6 | Failure | Failure |
| 2 | Ag—0.1% Bi—1% Cu | 960 | 2.60 | 92.3 | 7.7 | −1.3 | Failure | Failure |
| 3 | Ag—0.1% Bi—3% Cu | 959 | 1.79 | 90.1 | 9.9 | −1.7 | Good | Good |
| 4 | Ag—0.1% Bi—15% Cu | 881 | 0.62 | 63.5 | 36.5 | −1.9 | Good | Good |
| 5 | Ag—0.1% Bi—40% Cu | 780 | 0.21 | 55.8 | 44.2 | −2.5 | Good | Good |
| 6 | Ag—0.1% Bi—60% Cu | 821 | 0.24 | 49.5 | 50.5 | −7.6 | Good | Failure |
| 7 | Ag—0.005% Bi—15% Cu | 881 | 0.62 | 63.8 | 36.2 | −4.1 | Good | Failure |
| 8 | Ag—0.5% Bi—15% Cu | 881 | 0.47 | 60.5 | 39.5 | −1.0 | Good | Good |
| 9 | Ag—3.0% Bi—15% Cu | 875 | 0.17 | 54.1 | 45.9 | −3.1 | Good | Good |
| 10 | Ag—5.0% Bi—15% Cu | 864 | 0.13 | 41.7 | 58.3 | −6.9 | Good | Failure |
| 11 | Ag—0.1% Bi—15% Ge | 816 | 0.07 | 54.9 | 45.1 | −2.9 | Good | Good |
| 12 | Ag—0.1% Bi—15% Mg | 877 | 0.23 | 71.8 | 28.2 | −3.2 | Good | Good |
| 13 | Ag—0.1% Bi—15% Zn | 836 | 0.25 | 64.5 | 35.5 | −1.7 | Good | Good |

TABLE 2

| No. | Composition | Thermal conductivity (W/Kcm) | Reflectivity (%) (λ = 405 nm) | Absorptivity (%) (λ = 405 nm) | Change in reflectivity after environmental test (%) | Laser marking ability | Evaluation |
|---|---|---|---|---|---|---|---|
| 1A | pure Ag | 3.13 | 93.7 | 6.3 | −45.6 | Failure | Failure |
| 2A | Ag—0.1% Bi—15% Cu—0.05% Y | 0.62 | 63.4 | 36.6 | −1.9 | Good | Good |
| 3A | Ag—0.1% Bi—15% Cu—0.1% Y | 0.60 | 62.7 | 37.3 | −1.8 | Good | Good |
| 4A | Ag—0.1% Bi—15% Cu—1.0% Y | 0.42 | 56.8 | 43.2 | −1.6 | Good | Good |
| 5A | Ag—0.1% Bi—15% Cu—3.0% Y | 0.28 | 51.3 | 48.7 | −2.6 | Good | Good |
| 6A | Ag—0.1% Bi—15% Cu—5.0% Y | 0.20 | 45.2 | 54.8 | −12.5 | Good | Failure |
| No. 4 in Table 1 | Ag—0.1% Bi—15% Cu | 0.62 | 63.5 | 36.5 | −1.9 | Good | Good |

In the above examples, either one of Bi and Sb was added, and either one of Cu, Ge, Mg, and Zn was added (single addition) The similar advantages, however, are obtained as in the above examples when both of Bi and Sb are added, and when two or more of Cu, Ge, Mg, and Zn are added (combination addition).

The Ag alloy reflective films for optical information recording media according to the present invention can be easily marked by laser and are useful and advantageous as reflective films for optical information recording media such as read-only optical discs.

What is claimed is:

1. An Ag alloy reflective film for optical information recording media, consisting of:
    Ag as a main component;
    a total of 0.01 to 3 atomic percent of at least one of Bi and Sb;
    at least 15 atomic percent of Cu;
    optionally, one or more elements selected from the group consisting of Ge, Mg, and Zn, wherein the total of Cu, Ge, Mg, and Zn is 42 atomic percent or less; and
    optionally, 0.1 to 3 atomic percent of Y.

2. The Ag alloy reflective film of claim 1, wherein said Ag alloy reflective film contains 0.1 to 3 atomic percent of Y.

3. An optical information recording medium comprising the Ag alloy reflective film of claim 1.

4. The optical information recording medium of claim 3, for use in laser marking.

5. An Ag alloy sputtering target for the deposition of Ag alloy reflective films for optical information recording media, consisting of:
    Ag as a main component;
    0.1 to 3 atomic percent of Sb;
    at least 15 atomic percent of Cu;
    optionally, one or more elements selected from the group consisting of Ge, Mg, and Zn, wherein the total of Cu, Ge, Mg, and Zn is 42 atomic percent or less; and
    optionally, 0.1 to 3 atomic percent of Y.

6. An Ag alloy sputtering target for the deposition of Ag alloy reflective films for optical information recording media, consisting of:
    Ag as a main component;
    0.03 to 10 atomic percent of Bi;
    at least 15 atomic percent of Cu;
    optionally, one or more elements selected from the group consisting of Ge, Mg, and Zn, wherein the total of Cu, Ge, Mg, and Zn is 42 atomic percent or less; and
    optionally, 0.1 to 3 atomic percent of Y.

7. The Ag alloy sputtering target of claim 5, wherein said Ag alloy sputtering target contains 0.1 to 3 atomic percent of Y.

8. The Ag alloy sputtering target of claim 6, wherein said Ag alloy sputtering target contains 0.1 to 3 atomic percent of Y.

9. The Ag alloy reflective film of claim 1, wherein said Ag alloy reflective film contains Bi.

10. The Ag alloy reflective film of claim 1, wherein said Ag alloy reflective film contains Sb.

11. The Ag alloy reflective film of claim 1, wherein said Ag alloy reflective film contains Ge.

12. The Ag alloy reflective film of claim 1, wherein said Ag alloy reflective film contains Mg.

13. The Ag alloy reflective film of claim 1, wherein said Ag alloy reflective film contains Zn.

14. The Ag alloy reflective film of claim 1, wherein said Ag alloy reflective film consists of:
    Ag as a main component;
    0.01 to 3 atomic percent of Bi;
    at least 15 atomic percent of Cu.

15. The Ag alloy reflective film of claim 1, wherein said Ag alloy reflective film consists of:
    Ag as a main component;
    0.01 to 3 atomic percent of Bi;
    at least 15 atomic percent of Cu; and
    0.1 to 3 atomic percent of Y.

16. The optical information recording medium of claim 3, wherein the thickness of the Ag alloy reflective film ranges from 10 nm to 200 nm.

17. The optical information recording medium of claim 3, wherein the thickness of the Ag alloy reflective film ranges from 20 nm to 100 nm.

18. The Ag alloy sputtering target of claim 5, wherein said The Ag alloy sputtering target consists of:
    Ag as a main component;
    0.1 to 3 atomic percent of Sb;
    at least 15 atomic percent of Cu.

19. The Ag alloy sputtering target of claim 5, wherein said The Ag alloy sputtering target consists of:
    Ag as a main component;
    0.1 to 3 atomic percent of Sb;
    at least 15 atomic percent of Cu; and
    0.1 to 3 atomic percent of Y.

20. The Ag alloy sputtering target of claim 6, wherein said The Ag alloy sputtering target consists of:
    Ag as a main component;
    0.03 to 10 atomic percent of Bi;
    at least 15 atomic percent of Cu.

21. The Ag alloy sputtering target of claim 6, wherein said The Ag alloy sputtering target consists of:
   Ag as a main component;
   0.03 to 10 atomic percent of Bi;
   at least 15 atomic percent of Cu; and
   0.1 to 3 atomic percent of Y.

* * * * *